United States Patent

Ishikawa et al.

[11] Patent Number: 5,917,637
[45] Date of Patent: Jun. 29, 1999

[54] METHOD OF AND DEVICE FOR DRIVING OPTICAL MODULATOR, AND OPTICAL COMMUNICATIONS SYSTEM

[75] Inventors: George Ishikawa; Hiroshi Nishimoto, both of Kawasaki, Japan

[73] Assignee: Fujitsu Limited, Kawasaki, Japan

[21] Appl. No.: 08/766,060

[22] Filed: Dec. 16, 1996

[30] Foreign Application Priority Data

Dec. 26, 1995 [JP] Japan ..................................... 7-339482

[51] Int. Cl.$^6$ ................................................ H04B 10/04
[52] U.S. Cl. ................................ 359/181; 372/26; 372/38
[58] Field of Search .................................. 359/181, 180, 359/183, 187, 245; 372/26, 29, 38; 385/2, 3

[56] References Cited

U.S. PATENT DOCUMENTS

| | | | |
|---|---|---|---|
| 4,460,249 | 7/1984 | Vincent | 359/276 |
| 5,550,855 | 8/1996 | Aoyagi et al. | 372/50 |
| 5,706,116 | 1/1998 | Sugata | 359/180 |
| 5,706,117 | 1/1998 | Imai et al. | 359/187 |
| 5,732,097 | 3/1998 | Yamaguchi et al. | 372/38 |

FOREIGN PATENT DOCUMENTS 19600194 11/1996 Germany.

*Primary Examiner*—Thomas Mullen
*Attorney, Agent, or Firm*—Staas & Halsey

[57] ABSTRACT

A device and a method for driving an electro-absorption optical modulator for receiving carrier light emitted from a light source and outputting signal light subjected to intensity modulation according to the absorption of the carrier light. A bias circuit generates a bias voltage determined so that the optical modulator has a given chirping parameter. A driving circuit generates a modulating signal corresponding to an input signal, superimposes the modulating signal on the bias voltage, and supplies the superimposed signal to the optical modulator. A control circuit controls at least one parameter selected from a parameter group including the amplitude and duty of the modulating signal and the power of the carrier light, based on the bias voltage. It can be possible to provide a method of and a device for driving an optical modulator capable of arbitrarily setting a chirping parameter.

29 Claims, 12 Drawing Sheets

32'

30'

34'

36'

(RED SHIFT)

(BLUE SHIFT)

METHOD OF AND DEVICE FOR DRIVING OPTICAL MODULATOR, AND OPTICAL COMMUNICATIONS SYSTEM

BACKGROUND OF THE INVENTION

1. Field of the Invention

The present invention generally relates to driving of an electro-absorption optical modulator, and more specifically to a method of and a device for driving an electro-absorption optical modulator and to an optical communications system to which the device is applied.

2. Description of the Related Art

With a sudden increase in the amount of information, there has recently been a demand for a massive increase in storage of an optical communications system. Therefore, a transmission rate, i.e., a modulation rate has been increased. In direct intensity modulation of a laser diode, relatively large chirping (dynamic variations in wavelength due to relaxation vibrations or the like) will limit the transmission rate and the modulation rate. When signal light having chirping is transmitted through an optical fiber having wavelength dispersion (chromatic dispersion), distortion normally occurs in waveform. To avoid this problem, expectations for the use of an external optical modulator resistant to the generation of the chirping are generally rising.

A Mach-Zehnder type optical modulator (MZ modulator) has been developed as a practical external optical modulator. Carrier light having predetermined intensity, which is emitted from a light source, is supplied to the MZ modulator from which signal light subjected to intensity modulation is obtained by a switching operation using light interference. For example, an MZ modulator (described in the technical report LQE89-35 by Kiyono, et al. in Electronic Information Communications Association) using an $LiNbO_3$ crystal and an MZ modulator (described in the lecture preliminary report, pp. 25–29, by Inoue to the 8th optical symposium) using a compound semiconductor crystal have been reported.

The MZ modulator has frequently pointed-out drawbacks that a relatively large drive voltage is required, automatic bias control for holding an operating point constant is required and a device tends to increase in scale. With the foregoing drawbacks in view, an electro-absorption optical modulator (EA modulator) has been proposed as an external optical modulator which is capable of being driven under low power and is suitable for a size reduction. The EA modulator absorbs carrier light according to an applied voltage to thereby produce signal light subjected to intensity modulation. For example, an EA modulator (described in the technical report LQE95-17 by Yamada, et al. in Electronic Information Communications Association) using a compound semiconductor crystal has been reported.

A practical EA modulator is provided as a semiconductor chip by semiconductor lamination technology. The EA modulator is easily formed integrally with a laser diode used as a carrier light source. Thus, the EA modulator can provide a high output owing to a reduction in loss of coupling between the light source and the modulator and can be reduced in size owing to the integral formation. For example, a semiconductor chip (described in the technical report LQE95-17, pp. 1–6 by Morito, et al. in Electronic Information Communications Association) obtained by monolithically uniting a DFB-LD (Distributed Feed Back Laser Diode) and an EA modulator has been reported.

It became evident that wavelength chirp would be produced due to induced phase-modulated components depending on the type of optical modulator (F. Koyama, and K. Iga: J. Lightwave Technol., LT-6, (1988) pp. 87–93). The amount of the produced wavelength chirp is represented by chirping parameters of the optical modulator on a unity basis. A lightwave or optical pulse after having been transmitted is expanded or compressed according to the positive or negative chirping parameter. When signal light lying within a 1.55 $\mu$m band is transmitted through a silica fiber having a zero dispersion wavelength within a 1.3 $\mu$m band, the positive chirping parameter provides pulse expansion and the negative chirping parameter provides pulse compression.

It has been reported that the application of suitable chirping to a waveform to be transmitted (prechirping) has dramatically increased a transmission distance (K. Morito, R. Sahara, K. Sato, Y. Kotani, and H. Soda "MQW Modulator Integrated DFB Lasers for Multigigabit Transmission Systems" Proc. 21st Eur. Conf. on Opt. Comm. (ECOC 1995—Brussels) Th. B. 2.1, pp. 887–891). Thus, the performance of a system to which the optical modulator is applied, is improved on a great leap basis by making it possible to arbitrarily set the chirping parameter of the optical modulator.

SUMMARY OF THE INVENTION

Accordingly, an object of the present invention is to provide a method of and a device for driving an optical modulator capable of arbitrarily setting a chirping parameter so as to be suited to a system to be applied thereto.

Another object of the present invention is to provide an optical communications system to which the aforementioned method and device are applied.

According to one aspect of the present invention, there is provided a device for driving an EA modulator. The EA modulator receives therein carrier light emitted from a light source and absorbs the carrier light according to an applied voltage to thereby output signal light subjected to intensity modulation. A bias circuit generates a bias voltage determined so that the EA modulator has a given chirping parameter. A driving circuit generates a modulating signal corresponding to an input signal in response to the input signal, superimposes the modulating signal on the bias voltage and supplies the result of superimposition to the EA modulator as the applied voltage. A control means controls at least one parameter selected from a parameter group including the amplitude and duty of the modulating signal and the power of the carrier light, based on the bias voltage.

According to another aspect of the present invention, there is provided a driving method based on the operation of the device for driving the EA modulator.

According to a further aspect of the present invention, there is provided an optical communications system comprising a first terminal station having an optical transmitter, a second terminal station having an optical receiver and an optical fiber transmission path for coupling the first and second terminal stations to each other. The optical transmitter includes a light source for outputting carrier light therefrom, an EA modulator for receiving the carrier light therein and absorbing the carrier light according to an applied voltage to thereby output signal light subjected to intensity modulation, and the aforementioned driving device according to the present invention.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will hereinafter be described in detail with reference to the accompanying drawings.

Figure 1:
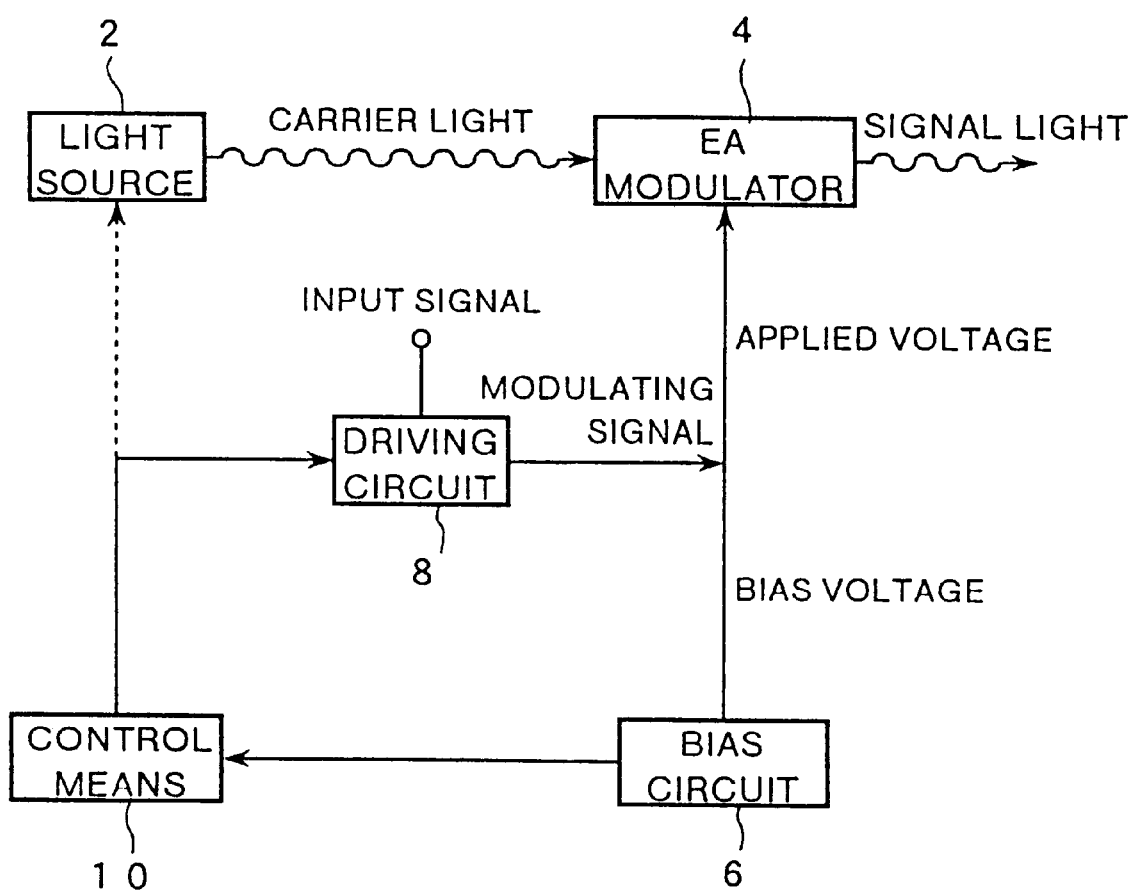
FIG. 1 is a block diagram showing a basic configuration of an optical transmitter to which the present invention is applied.

FIG. 1 is a block diagram showing a basic configuration of an optical transmitter to which the present invention is applied. A light source 2 outputs carrier light having a predetermined wavelength. A laser diode can be used as the light source 2. In this case, the power of the carrier light can be adjusted based on a bias current supplied to the laser diode. An EA modulator 4 outputs signal light subjected to intensity modulation in response to the carrier light emitted from the light source 2. The EA modulator 4 absorbs the carrier light according to an applied voltage to thereby produce signal light. A bias circuit 6 generates a bias voltage. The bias voltage is suitably determined so that the EA modulator 4 has a given chirping parameter. The determination of the bias voltage corresponding to the given chirping parameter will be described later. A driving circuit 8 generates a modulating signal corresponding to an input signal supplied thereto and superimposes the same on the bias voltage. The modulating signal and the bias voltage are supplied to the optical modulator 4 as voltages to be applied thereto. A control means 10 adjusts a parameter capable of changing the optimum value according to the bias voltage determined by the aforementioned given chirping parameter, based on the bias voltage. The parameter is selected from a parameter group including, for example, the amplitude and duty of the modulating signal and the power of the carrier light.

When the EA modulator 4 has such a characteristic curve that the power of the output light decreases as the absolute value of the applied voltage becomes large, the power of the output light is controlled in such a manner that the power of the carrier light is increased as the absolute value of the bias voltage becomes large. As a result, a variation in the power of the output light of the EA modulator 4 can be reduced and thereby the power of output light can be held constant. Further, when the EA modulator 4 has the specific characteristic curve referred to above, for example, the amplitude of the modulated signal is controlled in such a way that the amplitude of the modulated signal is made great as the absolute value of the bias voltage becomes large. Thus, a variation in attenuation or extinction ratio relative to the signal light can be reduced and thereby the extinction ratio can be kept constant.

Figure 2:
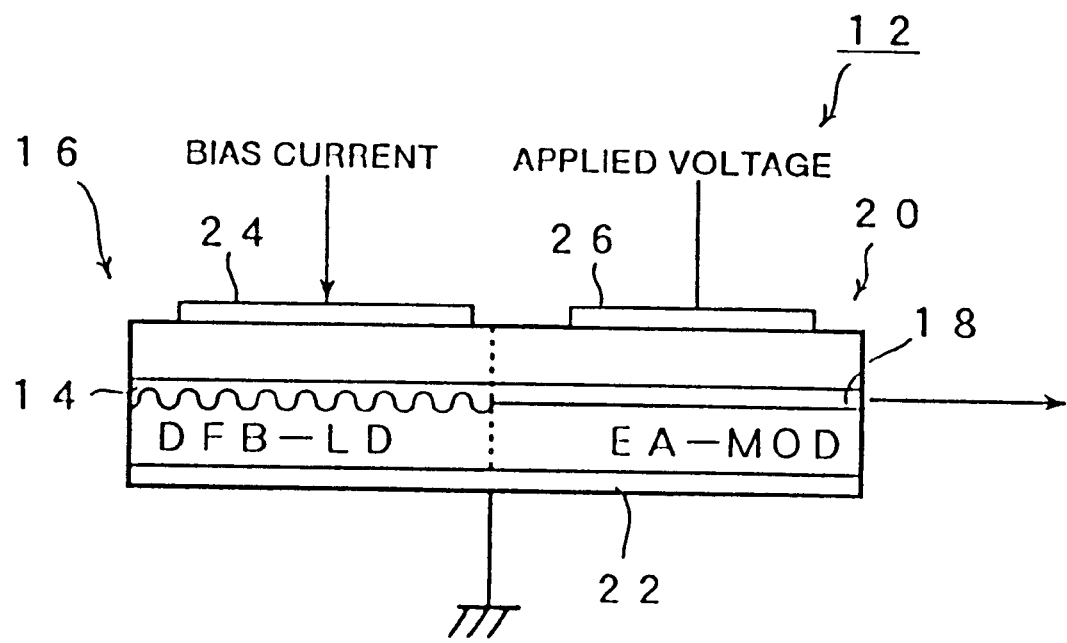
FIG. 2 is a diagram illustrating a configuration of an MI-LD (Modulator Integrated-Laser Diode)

FIG. 2 is a diagram showing the configuration of a modulator integrated laser diode (MI-LD) applicable to the present invention. The MI-LD is provided as a semiconductor chip having a direct-couple waveguide path structure including a multiple quantum well (MQW) layer composed of GaInAs, for example. In the example shown in the drawing, the MI-LD 12 comprises a distributed feedback (DFB) type laser diode (LD) 16 having an active layer for producing carrier light, and an EA modulator 20 having an absorption layer 18, both of which are shaped in integral form. The active layer 14 and the absorption layer 18 are directly coupled to each other in monolithic form. Reference numeral 22 indicates an electrode common to the LD 16 and the EA modulator 20. The electrode 22 is grounded, for example. The LD 16 has an electrode 24 for accepting a bias current therein, whereas the EA modulator 20 has an electrode 26 used for an applied voltage.

Since the MI-LD 12 has the active layer 14 and the absorption layer 18 both of which are directly coupled to each other in monolithic form, the carrier light generated by the active layer 14 is efficiently introduced into the absorption layer 18. Accordingly, a high-output type optical transmitter can be provided. Further, since the light source 2 and the EA modulator 4 shown in FIG. 1 can be provided as one micro semiconductor chip, the optical transmitter can be reduced in size.

Figure 3:
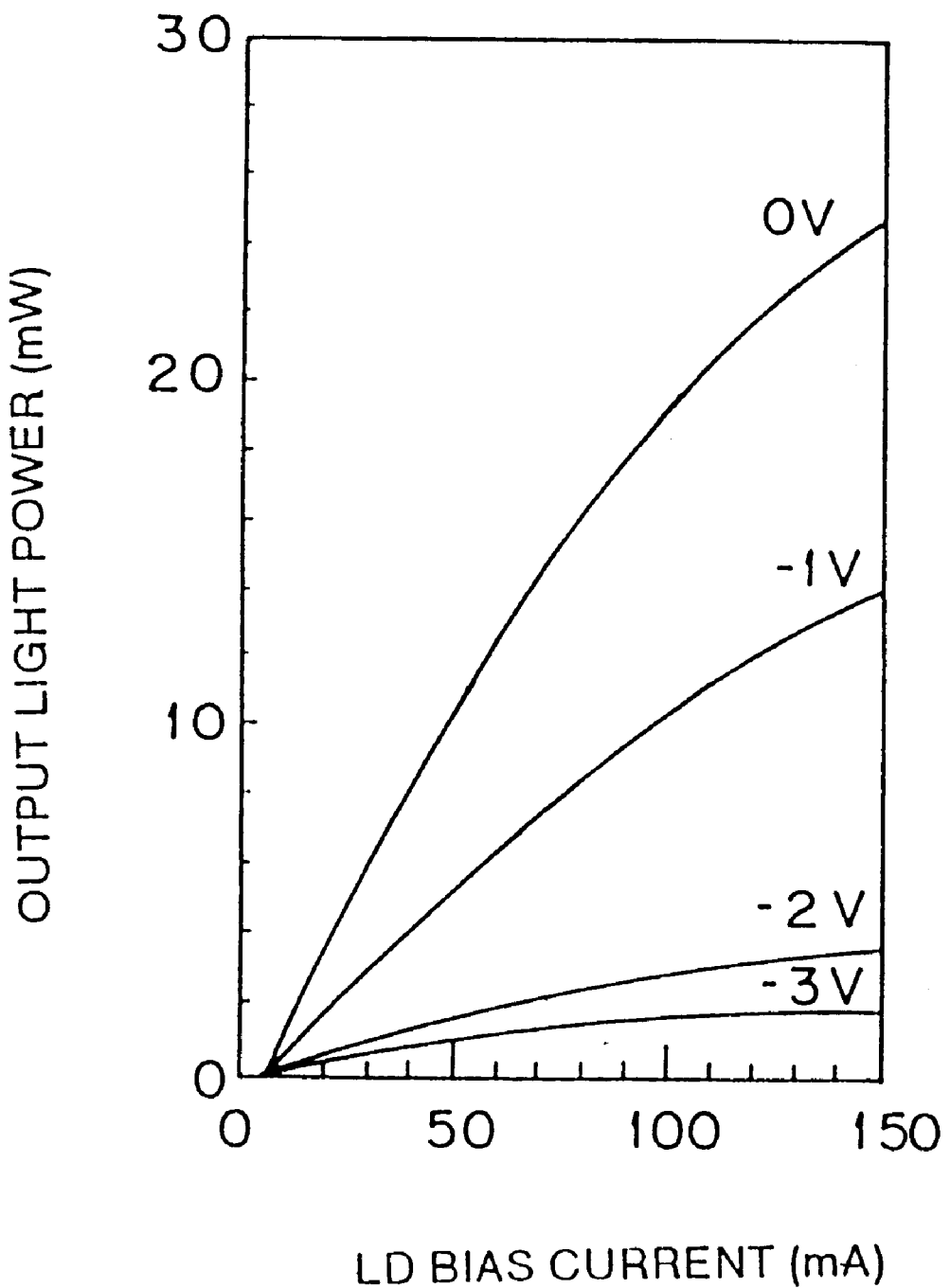
FIG. 3 is a graph for describing the relationship between output power of light and LD bias current.

FIG. 3 is a diagram showing one example of a static characteristic of the MI-LD shown in FIG. 2. The ordinate axis indicates power (mW) of light outputted from the EA modulator 20 and the abscissa axis indicates the bias current which flows into the LD 16. A static characteristic obtained by connecting the electrode 22 to ground and setting the potential at the electrode 26 to each of 0 V, −1 V, −2 V and −3 V is shown in the drawing. It is understood from this characteristic that a lightwave or optical pulse waveform whose extinction ratio is about 12 dB, can be obtained by driving the EA modulator 12 based on a pulse waveform whose high and low levels are respectively 0 V and −3 V.

Figure 4:
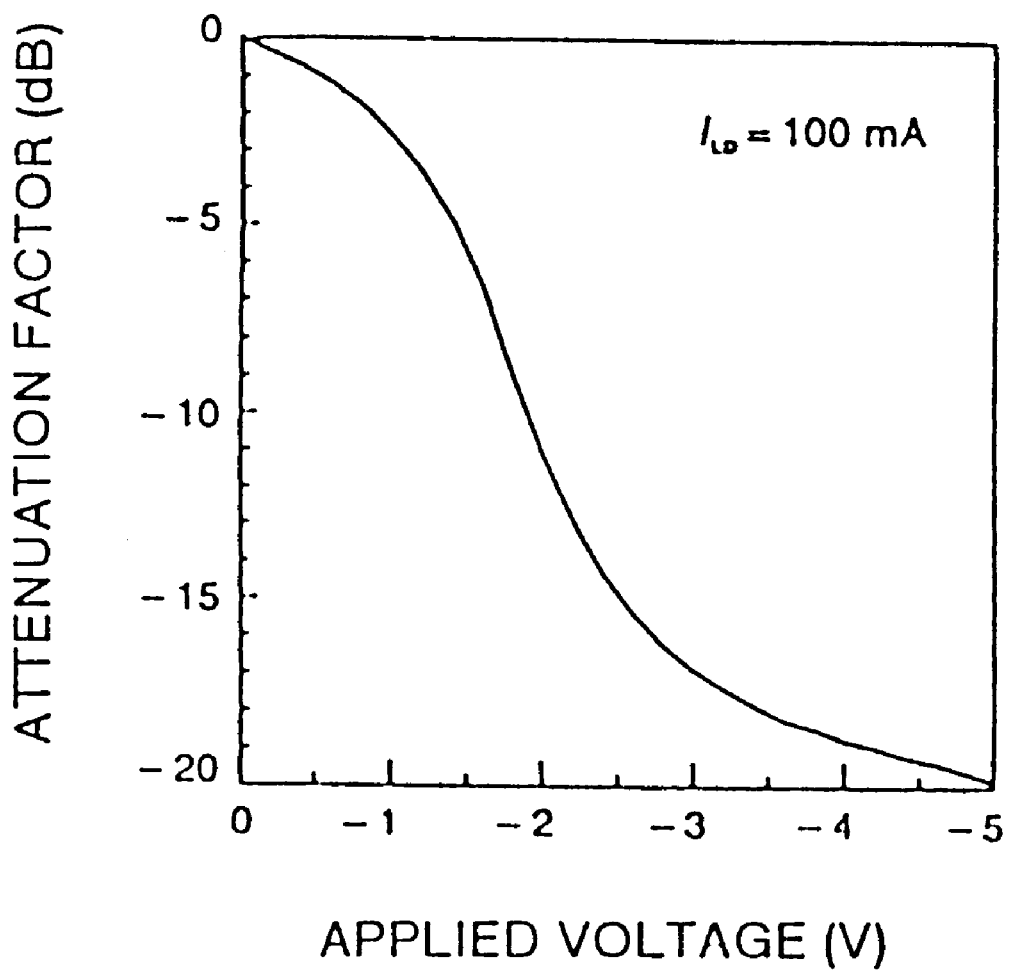
FIG. 4 is a graph for describing the relationship between an attenuation ratio and an applied voltage in an EA modulator.

FIG. 4 is a graph showing the relationship between an attenuation ratio (dB) and an applied voltage (V) in the MI-LD shown in FIG. 2. It should be noted that since the attenuation ratio of the ordinate axis is expressed in dB, the ordinate axis corresponds to the common logarithm of the power of output light from the MI-LD. In the MI-LD illustrated by way of example in FIG. 2, since the EA modulator 20 is driven in a reverse-biased state, a negative applied voltage is supplied to the electrode 26. FIG. 4 shows a characteristic obtained when the bias current that flows in the LD 16, is 100 mA. It is apparent from the characteristic that the attenuation ratio becomes large as the absolute value of the applied voltage increases.

Figure 5:
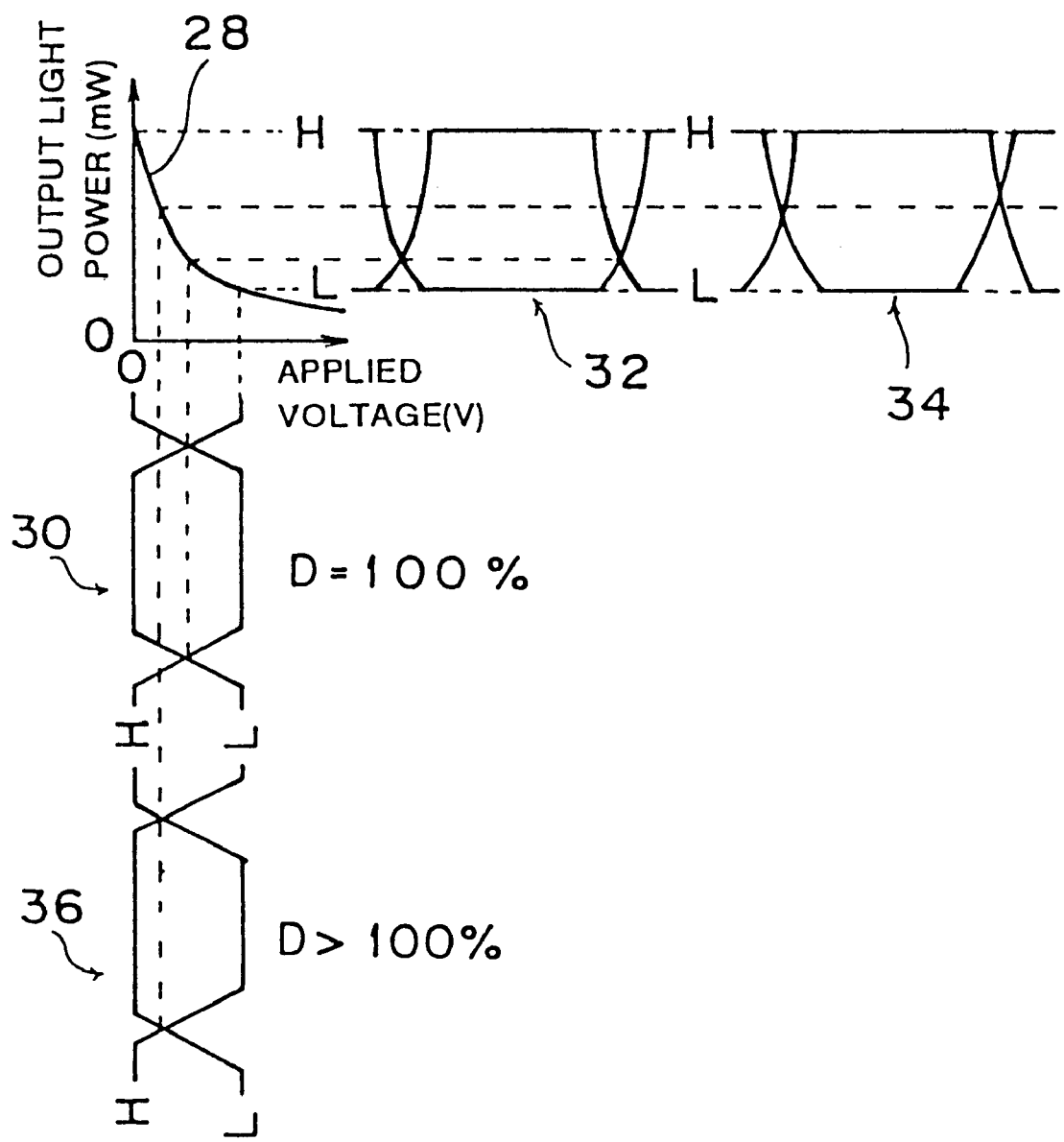
FIG. 5 is a diagram showing an operating characteristic of the MI-LD shown in FIG. 2.
Figure 6B:
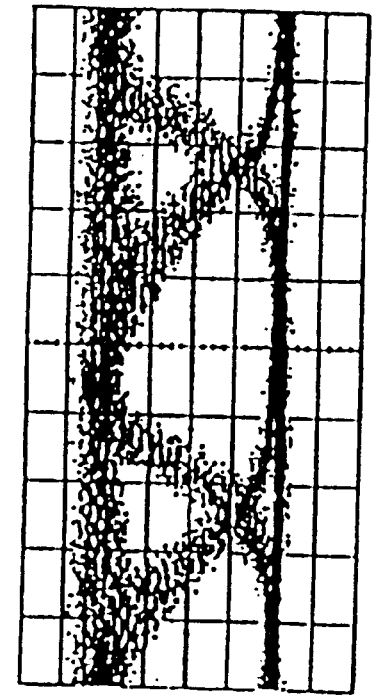
FIGS. 6A and 6B respectively illustrate actual examples of duty variations when cross points of modulating-signal waveforms exist in middle points.
Figure 6A:
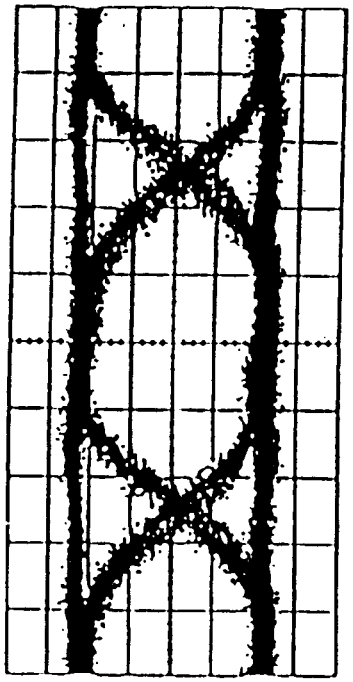
Figure 7B:
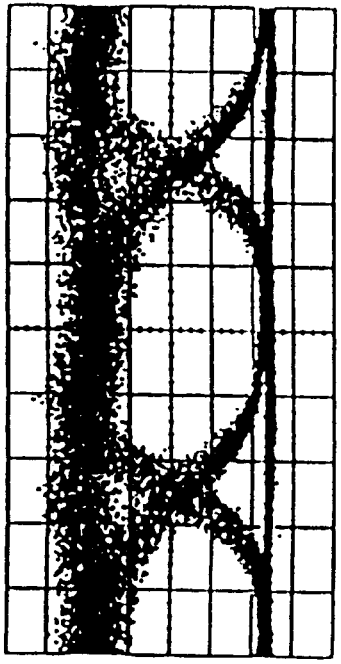
FIGS. 7A and 7B respectively illustrate actual examples of duty variations when cross points of signal light waveforms exist in middle points.
Figure 7A:
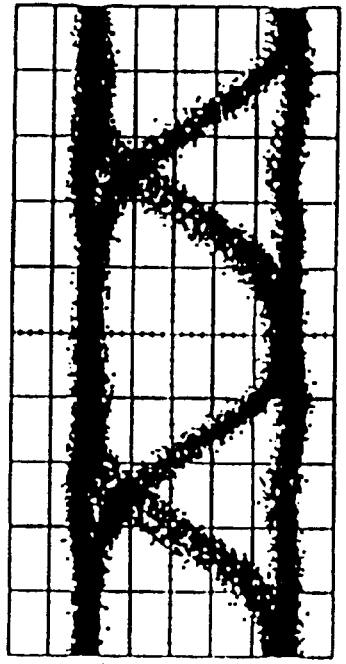

FIG. 5 is a diagram for describing an operating characteristic of the MI-LD shown in FIG. 2. Reference numeral 28 indicates a characteristic curve showing the relationship between light power (mW) outputted from the MI-LD and a voltage (V) applied to the MI-LD. It should be noted that since the scale of the output light power of the ordinate axis is linear, the shape of the characteristic curve 28 differs from that of the curve shown in FIG. 4.

The characteristic curve 28 has an inclination or gradient which decreases as the absolute value of the applied voltage becomes large. When the duty D of the modulating signal is 100% as designated at reference numeral 30, the point of intersection or crossing of output waveforms of signal light becomes lower than a middle point between a high level (H) and a low level (L) due to the fact that the characteristic curve 28 has the aforementioned shape. The aforementioned duty of 100% means that a cross point where a digital signal rise line intersects a digital signal fall line, coincides with a middle point between a high level (H) and a low level (L). Further, the duty smaller than 100% means that the cross point is close to the low level, and the duty larger than 100% means that the cross point is close to the high level.

When the system is designed so that the point of crossing of the waveforms of the signal light is brought to the middle point, the aforementioned change in duty from the electrical waveform to the optical waveform will cause degradation in receive sensitivity. In order to allow the cross point between the rise and fall lines of the output waveforms of the signal light to coincide with the middle point between the high and low levels as designated at reference numeral 34, it is necessary to set the duty of the modulating signal in advance so that the duty becomes larger than 100% as designated at reference numeral 36. Described specifically, since the duty of the input signal (input data) supplied to the driving circuit 8 shown in FIG. 1 is normally set to 100%, it should be noted that the driving circuit 8 needs to adjust the duty of the modulating signal superimposed on the bias voltage so that a suitable output waveform of signal light is obtained.

FIGS. 6A and 6B and FIGS. 7A and 7B respectively illustrate actual examples of duty variations. In the illustrated examples, NRZ modulation of 10 Gb/s has been effected on data. One scale of the abscissa axis in each data corresponds to 20 ps/div. A waveform record designated at reference numeral 30' in FIG. 6A corresponds to the waveform of the modulating signal designated at reference numeral 30 and its duty is 100%. A waveform record designated at reference numeral 32' in FIG. 6B corresponds to an output waveform of the signal light designated at reference numeral 32 in FIG. 5 and the cross point is reduced. Namely, the cross point approaches a low level. A waveform record designated at reference numeral 36' in FIG. 7A corresponds to the waveform of the modulating signal designated at reference numeral 36 in FIG. 5 and its duty is greater than 100%. A waveform record designated at reference numeral 34' in FIG. 7B corresponds to the output waveform of the signal light designated at reference numeral 34 in FIG. 5 and the cross point exists in the middle point.

A target value of the duty of the modulating signal, for setting the cross point between the output waveforms of the signal light to the middle point normally varies depending on which region of the characteristic curve 28 shown in FIG. 5 is used, i.e., determining to what extent the bias circuit 6 of FIG. 1 would produce the bias voltage. It is therefore desirable from the viewpoint of an improvement in receive sensitivity that the duty of the modulating signal is controlled so that the point of crossing of the output waveforms of the signal light is brought to the middle point between the high and low levels. The duty of the modulating signal is controlled based on the bias voltage, for example. The mode of specific control on the duty thereof will be described later.

Figure 8:
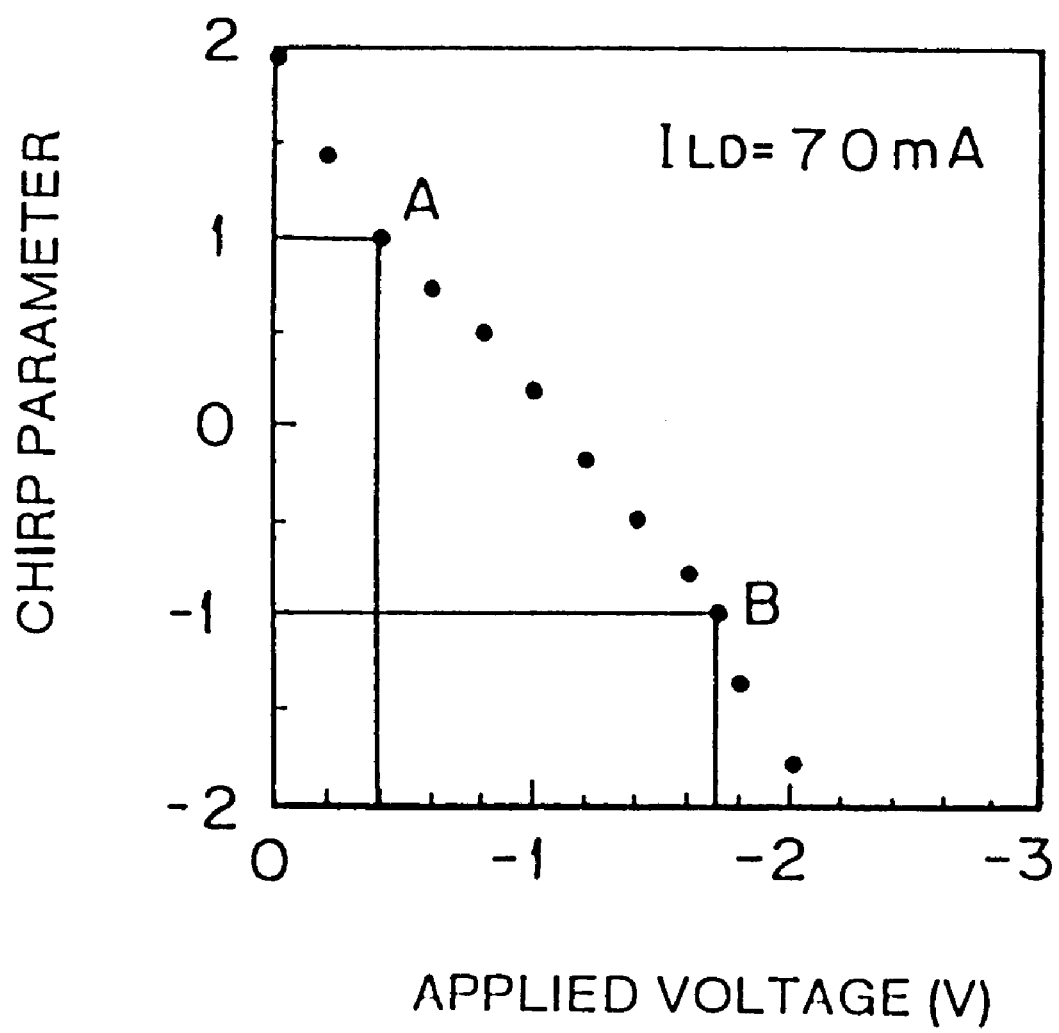
FIG. 8 is a graph for describing the relationship between a chirping parameter and an applied voltage.

Chirping parameters for the MI-LD shown in FIG. 2 were measured. FIG. 8 illustrates values obtained by measuring chirping parameters (non-unit) corresponding to various values of applied voltages (V) on condition that the bias current for carrier light is 70 mA.

The chirping parameter is equivalent to a quantity determined from an absorption spectrum, the rate of change in dispersion of a refractive index and an operating wavelength in an optical modulator. A wavelength chirp quantity $\Delta\lambda$ produced in the optical modulator is given by the following equation using the chirping parameter $\alpha$.

$$\Delta\lambda = \frac{-\alpha}{2} \frac{\lambda^2}{2\pi c} \frac{1}{P} \frac{dP}{dt}$$

where $\lambda$ indicates the wavelength of carrier light, c indicates the velocity of light, and P indicates an output power of light. Thus, the chirping parameter $\alpha$ may be as close as possible to zero to reduce the wavelength chirp of the optical modulator. Further, signal light (lightwave or optical pulse) having chirping of a blue shift can be obtained by rendering the chirping parameter $\alpha$ negative.

The application of the chirping having the blue shift to the optical pulse outputted from the optical modulator permits a reduction in expansion of the optical pulse due to wavelength dispersion when such an optical pulse is transmitted through an optical fiber having anomalous dispersion. Namely, the optical pulse can be compressed. A specific description about the pulse compression is as follows.

In the case of a single mode fiber, a group velocity generally increases on the short wavelength side rather than the zero dispersion wavelength as the wavelength becomes long(normal dispersion region). On the other hand, the group velocity decreases on the long wavelength side rather than the zero dispersion wavelength side as the wavelength becomes long(anomalous dispersion region). When an optical pulse lying within a 1.55 $\mu$m band is transmitted through a silica fiber whose zero dispersion wavelength lies within a 1.3 $\mu$m band, for example, a red shift is produced due to the anomalous dispersion so that the waveform of the optical pulse is expanded. Therefore, the chirping parameter $\alpha$ is set so that the optical modulator outputs signal light having a blue shift. This is called prechirping.

Figure 9A:
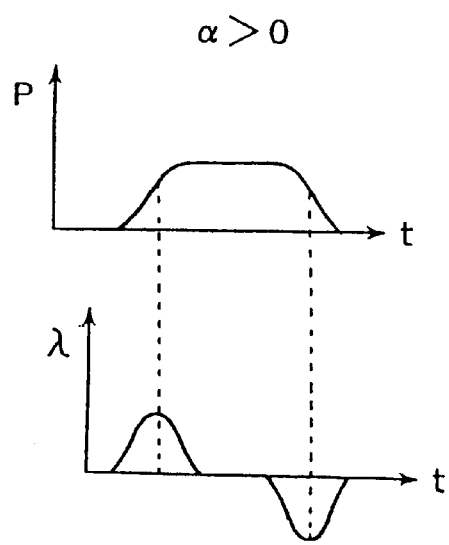
FIGS. 9A and 9B are diagrams for describing a red shift and a blue shift, respectively.
Figure 9B:
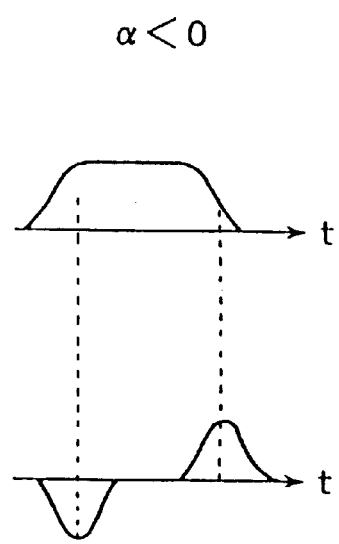

FIG. 9A illustrates a red shift ($\alpha>0$). In the drawing, shifts toward the short wavelength side and the long wavelength side respectively occur in the leading and trailing edges of an optical pulse. FIG. 9B illustrates a blue shift ($\alpha<0$). In the drawing, shifts toward the long wavelength side and the short wavelength side respectively occur in the leading and trailing edges of an optical pulse. Incidentally, the optical pulses will travel from left to right along time axes (t) in FIGS. 9A and 9B. P indicates power or the amplitude of an electric field, and $\lambda$ indicates a wavelength.

Figure 10:
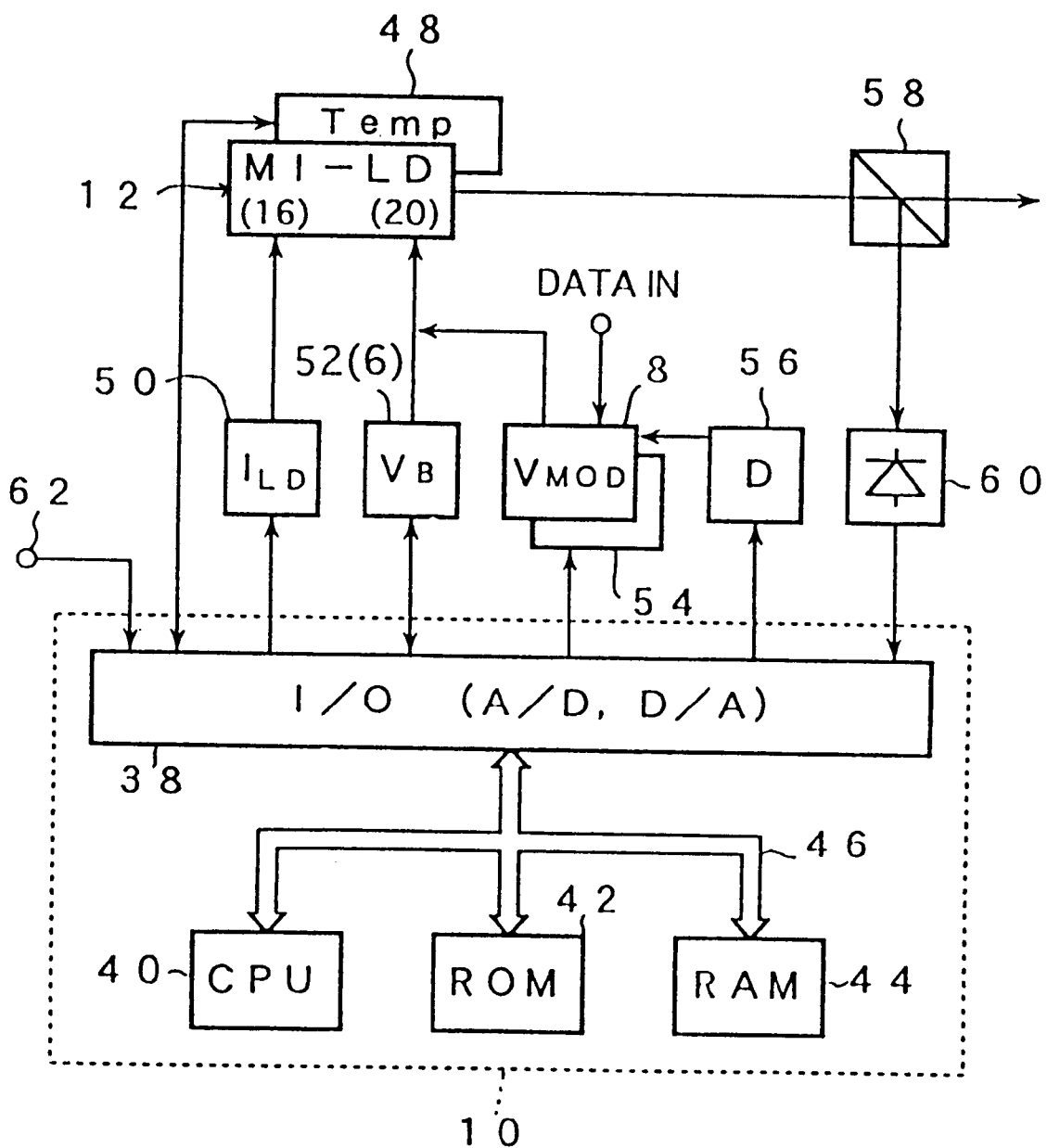
FIG. 10 is a block diagram showing an embodiment of an optical transmitter to which the present invention is applied.

FIG. 10 is a block diagram showing an embodiment of an optical transmitter having the MI-LD shown in FIG. 2. The control means 10 shown in FIG. 1 consists of an I/O port 38 for inputting and outputting a signal, which includes an A/D converter and a D/A converter, a CPU (Central Processing Unit) 40 for computing a target value of a bias current and the like in accordance with a predetermined program, a ROM (Read-Only Memory) 42 which stores data used for programs and data tables therein, a RAM (Random Access Memory) 44 for temporarily storing the result of computation therein, and a data bus 46 for connecting these to one another.

A temperature controller 48 is provided so as to be added to the MI-LD 12. The CPU 40 takes in or captures temperature data of the MI-LD 12 from the temperature controller 48 through the I/O port 38. A target value of the temperature is supplied from the CPU 40 to the temperature controller 48 through the I/O port 38. A bias current circuit 50 supplies a bias current $I_{LD}$ for outputting carrier light, to the LD 16. A target value of the bias current is supplied from the CPU 40 to the bias current circuit 50 through the I/O port 38. The value of a bias voltage $V_B$ generated by a bias voltage circuit 52(6) to supply it to the EA modulator 20 is captured by the CPU 40 through the I/O port 38. This is intended to control the amplitude of a modulating signal $V_{MOD}$ or the like based on the bias voltage. A target value of the bias voltage, which is set so that the EA modulator 20 has a given chirping parameter, is supplied from the CPU 40 to the bias voltage circuit 52 through the I/O port 38.

An amplitude variable circuit 54 is provided so as to be attached to a driving circuit 8 for superimposing the modulating signal $V_{MOD}$, on the bias voltage $V_B$. A target value of the amplitude is supplied from the CPU 40 to the amplitude variable circuit 54 via the I/O port 38. The amplitude variable circuit 54 controls the amplitude of the modulated signal outputted from the driving circuit 8 so that it coincides with the target value. A duty variable circuit 56 controls the duty of the modulated signal $V_{MOD}$ outputted from the driving circuit 8. A target value of the duty is supplied from the CPU 40 to the duty variable circuit 56 via the I/O port 38.

Signal light outputted from the MI-LD 12 is divided into first branch light equivalent to the most part of the total output and the remaining second branch light by a beam splitter 58. The first branch light is transmitted to an unillustrated optical transmission path and the second branch light is supplied to a photodetector 60. The photodetector 60 converts partial signal light supplied thereto into an electric signal, which is in turn captured by the CPU 40 via the I/O port 38.

The optical transmitter has a port 62 for inputting, for example, preset data about chirping parameters, monitoring data about transfer characteristics on the receiving side, which will be described later. The input data is captured by the CPU 40 via the I/O port 38.

Figure 11A:
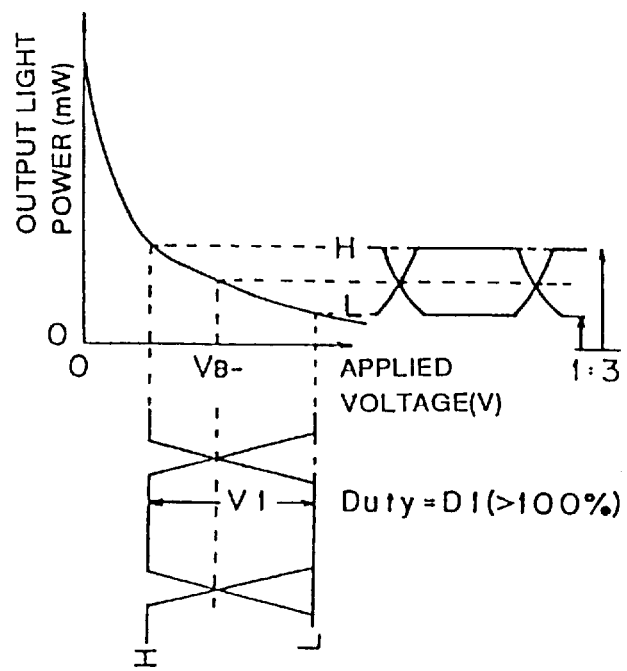
FIGS. 11A and 11B are diagrams for describing the operation of the optical transmitter shown in FIG. 10.
Figure 11B:
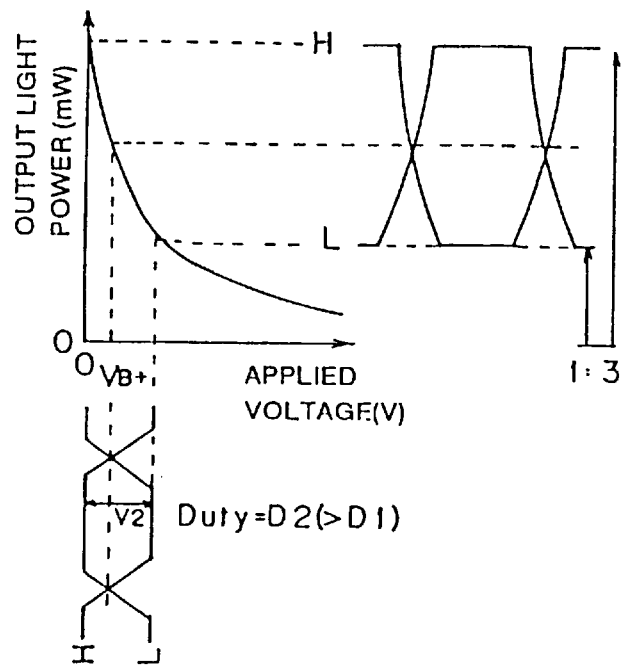

FIGS. 11A and 11B are diagrams for describing the operation of the optical transmitter shown in FIG. 10. FIG. 11A shows a case in which a bias voltage $V_{B-}$ whose absolute value is relatively large, is set to activate the optical transmitter in a negative chirping parameter region. In the illustrated example, the bias voltage $V_{B-}$ corresponds to the point of crossing of output waveforms of signal light. Since, however, a chirping parameter corresponding to a high level of each signal light waveform is substantially predominant, a target value of the bias voltage may be caused to correspond to the high level of each waveform of the signal light.

It is desirable that in order to improve the extinction ratio relative to the output signal light, the amplitude of the modulating signal is made great as the absolute value of the bias voltage becomes large. In FIG. 11A, the output signal light is represented as an extinction ratio of 1:3 with respect to the amplitude V1 of the modulating signal. Further, the duty of the modulating signal is set to D1 (>100%) so that the cross point between the output waveforms of the signal light is brought to a middle point between high and low levels.

If the characteristic curve is given, then the optimum values of both the amplitude and the duty of the modulating signal are univocally determined with respect to the bias voltage. Therefore, the optimum values of both the amplitude and the duty of the modulating signal, both of which correspond to each individual value of the bias voltage, are stored in the ROM 42 shown in FIG. 10. The CPU 40 calculates target values of both the amplitude and the duty of the modulating signal based on the storage table.

When a bias voltage $V_{B+}$ whose absolute value is relatively small, is set to activate the optical transmitter in a positive chirping parameter region as shown in FIG. 11B, the amplitude of a modulating signal is changed to V2 (<V1) to keep the extinction ratio constant. Further, the duty of the modulating signal is changed to D2 (>D1) so that the point of crossing of output waveforms of signal light is kept at the middle point between high and low levels.

It should be noted that when the power of carrier light is constant, the output power of the signal light decreases as the absolute value of the bias voltage applied to the EA modulator becomes large. Thus, in the present embodiment, a target value of a bias current supplied from the bias current circuit 50 to the LD 16 is set in such a manner that the power of the carrier light increases as the absolute value of the bias voltage becomes great.

Feed-forward control can be adopted to reduce a variation in output power of the signal light due to a change in bias voltage applied to the EA modulator. Since the optimum values of LD bias currents with respect to individual values of bias voltages are obtained if a characteristic curve is given, they are stored in the ROM 42. Further, the CPU 40 calculates the optimum value of the LD bias current based on the value of the bias voltage captured from the bias voltage circuit 52.

Since the photodetector 60 for receiving part of the output signal light therein is provided in the embodiment shown in FIG. 10, feedback control on the LD bias current can be also effected. Namely, the CPU 40 sequentially calculates the target value of the LD bias current so that the level of the signal outputted from the photodetector 60 is held constant. Thereafter, the bias current circuit 50 supplies the calculated bias current to the LD 16.

When the absolute value of the bias voltage supplied to the EA modulator is increased to bring about the merit of obtaining the prechirping of the blue shift, the demerit of degrading the extinction ratio relative to the output signal light and reducing the optical output power takes place. It is thus desired that the condition for driving the EA modulator is determined in accordance with a loss produced in the optical transmission path or wavelength dispersion in view of such a tradeoff. As drive parameters to be controlled, may be mentioned the bias voltage applied to the EA modulator, the duty and amplitude of the modulating signal and the LD bias current, and the temperature of the single EA modulator or the temperature of MI-LD.

The present invention is limited by simply controlling at least one drive parameter on the basis of the bias voltage applied to the EA modulator, which is determined according to the given chirping parameter. It is however desirable to control a plurality of drive parameters on a sequential basis. Since the extinction ratio is degraded or rendered improper as the absolute value of the bias voltage applied to the EA modulator increases, for example, the amplitude of the modulating signal is made great to compensate for the degradation. However, a limitation is imposed on the enlargement of the amplitude. In such a case, the temperature for the optical modulator is selected from the drive parameter group to improve the extinction ratio. A specific improvement is as follows.

When the temperature of MI-LD 12 is raised in the optical transmitter shown in FIG. 10, the degree or level of wavelength detuning between the LD 16 and the EA modulator 20, i.e., the difference between the wavelength of the carrier light outputted from the LD 16 and a wavelength which provides a band gap in the EA modulator 20 is reduced so that the extinction ratio is improved. This reduction can be understood from a variation in the shape of a characteristic curve which relates the power of the output light to the applied voltage. Thus, since the optimum values of other drive parameters to be controlled vary due to a change in characteristic curve when the temperature is of an object to be controlled, it is desired that the ROM 42 includes a data table set in advance for each value of temperature. In the given embodiment of the present invention as described above, the control means 10 shown in FIG. 1 includes a means for controlling the temperature of the EA modulator in such a manner that the temperature rises as the bias voltage applied to the EA modulator 4 increases. It should be also considered that when this type of data table is created, the power of the carrier light is reduced as the temperature of the LD 16 rises.

Since the MI-LD 12 is used as the light source 2 and the EA modulator 4 (see FIG. 1) in the optical transmitter shown in FIG. 10, an optical transmitter can be provided which is capable of enhancing the efficiency of coupling between the light source and the modulator, providing a high output and reducing the size thereof. Further, the control on the temperatures of the light source and the modulator can be performed by the single temperature controller 48.

In another embodiment of the present invention, the bias voltage circuit 6 shown in FIG. 10 includes a means for selectively generating a first bias voltage used to supply a positive first chirping parameter and a second bias voltage used to supply a negative second chirping parameter. Referring to FIG. 8, for example, −0.4V and −1.7V are respectively supplied as the first and second bias voltages to perform switching between +1 and −1 chirping parameters respectively indicated by dots A and B in FIG. 8. Since the control means 10 may include a means for selecting one or plural drive parameters between two values respectively corresponding to the first and second bias voltages in this case, the control means 10 permits an easy computation of the CPU 40.

Thus, the positive or negative selection of the chirping parameters equal in absolute value to each other permits the provision of an optical transmitter useful in a manner similar to one using an MZ modulator. In the MZ modulator, the positive or negative selection of chirping parameters can be easily performed by simply changing an operating point on an operating characteristic curve analogous to a sine wave by a half period.

Figure 12:
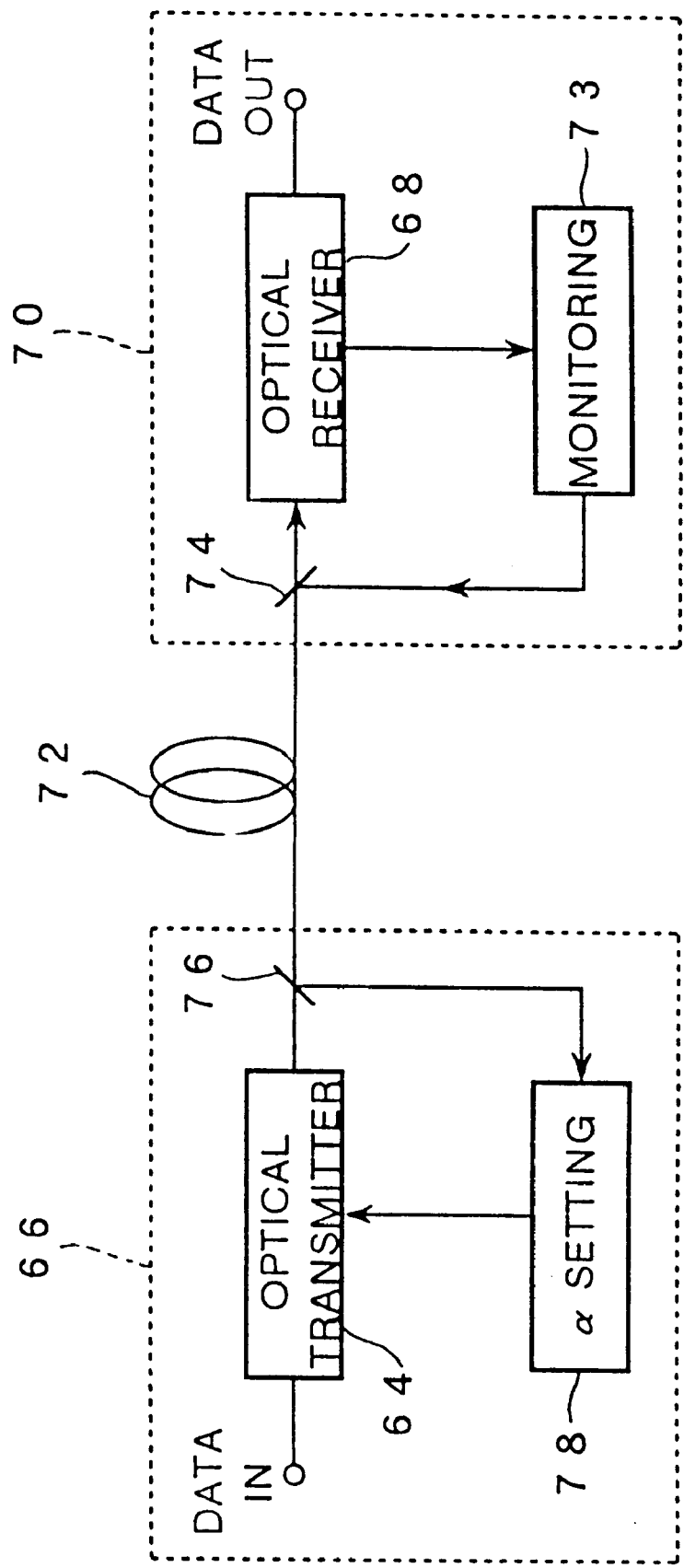
FIG. 12 is a block diagram illustrating an embodiment of an optical communications system according to the present invention.

FIG. 12 is a block diagram showing an embodiment of an optical communications system of the present invention. The optical communications system includes a first terminal station 66 having an optical transmitter 64, a second terminal station 70 having an optical receiver 68, and an optical fiber transmission path 72 for establishing a link between the first and second terminal stations 66 and 70. The optical transmitter 64 has the basic configuration shown in FIG. 1, preferably, the embodiment shown in FIG. 10. The optical transmitter 64 generates signal light based on an input signal and transmits the generated signal light to a first end of the optical fiber transmission path 72. The signal light, which has been transmitted through the optical fiber transmission path 72 and outputted from a second end thereof, is supplied to the optical receiver 68, which in turn demodulates an output signal with respect to the input signal applied to the optical transmitter 64. Further, the second terminal station 70 has a monitoring circuit 73 for monitoring a transmission characteristic about the received signal light and a means 74 for coupling the monitoring data to the optical fiber transmission path 72 in the reverse direction.

The monitoring data is transmitted to the first terminal station 66. The first terminal station 66 has a means 76 for extracting the transmitted monitoring data and a chirping parameter setting circuit 78 for setting a chirping parameter for the optical transmitter 64 based on the data.

As the transmission characteristic measured by the monitoring circuit 73, may be mentioned a bit error rate (BER), a signal-to-noise ratio (Q value) of an electric signal, a check of a parity bit in a signal, an equal-bit error rate curve, an eyemask pattern, etc.

When the optical fiber transmission path 72 is composed of a silica fiber having a zero dispersion wavelength within a 1.3 μm band, the chirping parameter setting circuit 78 sets a negative chirping parameter to the signal light lying within the 1.55 μm band as described above. Namely, the chirping parameter is given according to the wavelength dispersion on the optical fiber transmission path 72.

Since the optical transmitter 64 includes the drive device of the present invention in the system shown in FIG. 12, the optimum transmission characteristic can be obtained according to variations (including a variation with time) in loss produced in the optical fiber transmission path 72 or wavelength dispersion thereof. Namely, it is possible to provide an optical modulator having high general versatility, which is capable of flexibly coping with the design or change in system, or a circuit for driving the optical modulator, or an optical transmitter.

When an unillustrated reserve line substantially equivalent in laying environment to the operation line (optical fiber transmission line 72) exists, respective drive parameters are first optimized for the reserve line to avoid service-down, after which the optimized parameters can be applied to the operation line by reference to them. The monitoring data may be transmitted through an electric line or a radio line.

According to the present invention, as has been described above, an advantageous effect can be brought about that a method of and a device for driving an optical modulator capable of arbitrarily setting a chirping parameter so as to be suited to an applied system can be provided.

Further, an advantageous effect can be brought about that an optical communications system to which the method and device according to the present are applied, can be provided.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A device for driving an electro-absorption optical modulator for receiving therein carrier light emitted from a light source and absorbing the carrier light according to an applied voltage to thereby output signal light subjected to intensity modulation, comprising:

a bias circuit for generating a bias voltage determined so that said optical modulator has a given chirping parameter;

a driving circuit for generating a modulating signal corresponding to an input signal in response to the input signal, superimposing the modulating signal on the bias voltage and supplying the result of superimposition to said optical modulator as the applied voltage; and a control means for controlling at least one parameter selected from a parameter group including the amplitude and duty of the modulating signal and the power of the carrier light, based on the bias voltage.

2. A device according to claim 1, wherein said optical modulator has such a characteristic curve that the power of the output light of said optical modulator is reduced as the absolute value of the applied voltage increases.

3. A device according to claim 2, wherein said control means includes a means for controlling the power of the carrier light in such a manner that the power of the carrier light becomes great as the absolute value of the bias voltage increases.

4. A device according to claim 2, wherein said control means includes a means for controlling the amplitude of the modulating signal in such a manner that the amplitude of the modulating signal becomes great as the absolute value of the bias voltage increases.

5. A device according to claim 2, wherein said characteristic curve has a gradient which decreases as the absolute value of the applied voltage increases, and said control means includes a means for controlling the duty of the modulating signal in such a manner that the point of crossing of waveforms of the signal light is situated at midpoint between a high level and a low level.

6. A device according to claim 1, wherein said parameter group further includes a temperature of said optical modulator and said control means includes a means for varying the temperature of said optical modulator in accordance with a change in the bias voltage.

7. A device according to claim 6, wherein the temperature of said optical modulator is raised as the absolute value of the bias voltage increases.

8. A device according to claim 1, wherein said bias circuit includes a means for selectively generating a first bias voltage for supplying a first chirping parameter and a second bias voltage for supplying a second chirping parameter, and said control means includes a means for switching said at least one parameter between two values respectively corresponding to the first and second bias voltages.

9. A device according to claim 1, wherein said light source comprises a laser diode having an active layer for generating the carrier light having power corresponding to a bias current supplied thereto, said optical modulator has an absorption layer for absorbing the carrier light, said laser diode and said optical modulator are monolithically united so that the active layer and the absorption layer are directly coupled to each other, and the power of said carrier light is controlled based on the bias current.

10. A device according to claim 1, further comprising a means for detecting the power of the output light of said optical modulator and wherein said control means includes a means for controlling the power of the carrier light so that the detected power is kept constant.

11. An optical communications system comprising:
a first terminal station having an optical transmitter;
a second terminal station having an optical receiver; and
an optical fiber transmission path for coupling said first and second terminal stations to each other, said optical transmitter comprising
a light source for outputting carrier light therefrom,
an electro-absorption optical modulator for receiving the carrier light therein and absorbing the carrier light according to an applied voltage to thereby output signal light subjected to intensity modulation,
a bias circuit for generating a bias voltage determined so that said optical modulator has a given chirping parameter,
a driving circuit for generating a modulating signal corresponding to an input signal in response to the input signal, superimposing the modulating signal on the bias voltage and supplying the result of superimposition to said optical modulator as the applied voltage, and
a control means for controlling at least one parameter selected from a parameter group including the amplitude and duty of the modulating signal and the power of the carrier light, based on the bias voltage.

12. An optical communications system according to claim 11, wherein said chirping parameter is given according to wavelength dispersion on said optical fiber transmission path.

13. An optical communications system according to claim 12, wherein the wavelength of the signal light lies within a 1.55 $\mu$m band, said optical transmission path comprises a silica fiber having a zero dispersion wavelength within a 1.3 $\mu$m band and said chirping parameter is given as a negative value.

14. An optical communications system according to claim 11, wherein said second terminal station further has a means for monitoring a transmission characteristic concerning the signal light and said chirping parameter is given based on the monitored transmission characteristic.

15. A method of driving an electro-absorption optical modulator for receiving therein carrier light emitted from a light source and absorbing the carrier light according to an applied voltage to thereby output signal light subjected to intensity modulation, comprising the steps of:
(a) generating a bias voltage determined so that said optical modulator has a given chirping parameter;
(b) generating a modulating signal corresponding to an input signal, superimposing the modulating signal on the bias voltage and supplying the result of superimposition to said optical modulator as the applied voltage; and
(c) controlling at least one parameter selected from a parameter group including the amplitude and duty of the modulating signal and the power of the carrier light, based on the bias voltage.

16. A device for driving an electro-absorption optical modulator for receiving therein carrier light emitted from a light source and absorbing the carrier light according to an applied voltage to thereby output signal light subjected to intensity modulation, comprising:
a bias circuit generating a bias voltage determined so that said optical modulator has a given chirping parameter;
a driving circuit generating a modulating signal corresponding to an input signal in response to the input signal, superimposing the modulating signal on the bias voltage and supplying the result of superimposition to said optical modulator as the applied voltage; and
a controller controlling at least one parameter selected from a parameter group including the amplitude and duty of the modulating signal and the power of the carrier light, based on the bias voltage.

17. A device according to claim 16, wherein said optical modulator has such a characteristic curve that the power of the output light of said optical modulator is reduced as the absolute value of the applied voltage increases.

18. A device according to claim 17, wherein said controller includes a power controller controlling the power of the carrier light in such a manner that the power of the carrier light becomes great as the absolute value of the bias voltage increases.

19. A device according to claim 17, wherein said controller includes an amplitude controller controlling the amplitude of the modulating signal in such a manner that the amplitude of the modulating signal becomes great as the absolute value of the bias voltage increases.

20. A device according to claim 17, wherein said characteristic curve has a gradient which decreases as the absolute value of the applied voltage increases, and said controller includes a duty controller controlling the duty of the modulating signal in such a manner that the point of crossing of waveforms of the signal light is situated at midpoint between a high level and a low level.

21. A device according to claim 16, wherein said parameter group further includes a temperature of said optical modulator and said controller includes a temperature varying device varying the temperature of said optical modulator in accordance with a change in the bias voltage.

22. A device according to claim 21, wherein the temperature of said optical modulator is raised as the absolute value of the bias voltage increases.

23. A device according to claim 16, wherein said bias circuit includes a generating device selectively generating a first bias voltage for supplying a first chirping parameter and a second bias voltage for supplying a second chirping parameter, and said controller includes a switching device switching said at least one parameter between two values respectively corresponding to the first and second bias voltages.

24. A device according to claim 16, wherein said light source comprises a laser diode having an active layer for generating the carrier light having power corresponding to a bias current supplied thereto, said optical modulator has an absorption layer for absorbing the carrier light, said laser diode and said optical modulator are monolithically united so that the active layer and the absorption layer are directly coupled to each other, and the power of said carrier light is controlled based on the bias current.

25. A device according to claim 16, further comprising a detector detecting the power of the output light of said optical modulator and wherein said controller includes a power controller device controlling the power of the carrier light so that the detected power is kept constant.

26. An optical communications system comprising:
a first terminal station having an optical transmitter;
a second terminal station having an optical receiver; and
an optical fiber transmission path coupling said first and second terminal stations to each other, wherein said optical transmitter comprises
a light source outputting carrier light therefrom,
an electro-absorption optical modulator receiving the carrier light therein and absorbing the carrier light according to an applied voltage to thereby output signal light subjected to intensity modulation,
a bias circuit generating a bias voltage determined so that said optical modulator has a given chirping parameter,
a driving circuit generating a modulating signal corresponding to an input signal in response to the input signal, superimposing the modulating signal on the bias voltage and supplying the result of superimposition to said optical modulator as the applied voltage, and
a controller controlling at least one parameter selected from a parameter group including the amplitude and duty of the modulating signal and the power of the carrier light, based on the bias voltage.

27. An optical communications system according to claim 26, wherein said chirping parameter is given according to wavelength dispersion on said optical fiber transmission path.

28. An optical communications system according to claim 27, wherein the wavelength of the signal light lies within a 1.55 $\mu$m band, said optical transmission path comprises a silica fiber having a zero dispersion wavelength within a 1.3 $\mu$m band and said chirping parameter is given as a negative value.

29. An optical communications system according to claim 26, wherein said second terminal station further has a monitoring device monitoring a transmission characteristic concerning the signal light and said chirping parameter is given based on the monitored transmission characteristic.

* * * * *